United States Patent
Khlat et al.

(10) Patent No.: US 11,894,767 B2
(45) Date of Patent: Feb. 6, 2024

(54) POWER MANAGEMENT CIRCUIT OPERABLE TO REDUCE RUSH CURRENT

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 343 days.

(21) Appl. No.: 17/316,828

(22) Filed: May 11, 2021

(65) Prior Publication Data
US 2022/0021302 A1    Jan. 20, 2022

Related U.S. Application Data

(60) Provisional application No. 63/051,932, filed on Jul. 15, 2020.

(51) Int. Cl.
H03F 1/02 (2006.01)
H02M 3/07 (2006.01)
H03F 3/21 (2006.01)

(52) U.S. Cl.
CPC ............ H02M 3/07 (2013.01); H03F 1/0238 (2013.01); H03F 3/211 (2013.01); *H03F 2200/451* (2013.01)

(58) Field of Classification Search
CPC ................................................... H03F 1/0238
See application file for complete search history.

(56) References Cited

U.S. PATENT DOCUMENTS

| | | | |
|---|---|---|---|
| 7,859,338 B2 | 12/2010 | Bajdechi et al. | |
| 8,159,309 B1 | 4/2012 | Khlat et al. | |
| 8,718,188 B2 | 5/2014 | Balteanu et al. | |
| 8,912,769 B2 | 12/2014 | Lin et al. | |

(Continued)

FOREIGN PATENT DOCUMENTS

| | | |
|---|---|---|
| DE | 102019218816 A1 | 6/2020 |
| WO | 2018187245 A1 | 10/2018 |
| WO | 2021016350 A1 | 1/2021 |

OTHER PUBLICATIONS

U.S. Appl. No. 17/182,539, filed Feb. 23, 2021.

(Continued)

*Primary Examiner* — Patricia T Nguyen
(74) *Attorney, Agent, or Firm* — Withrow & Terranova, P.L.L.C.

(57) ABSTRACT

A power management circuit operable to reduce rush current is provided. The power management circuit is configured to provide a time-variant voltage(s) to a power amplifier(s) for amplifying a radio frequency (RF) signal(s). Notably, a variation in the time-variant voltage(s) can cause a rush current that is proportionally related to the variation of the time-variant voltage(s). To reduce the rush current, the power management circuit is configured to maintain the time-variant voltage(s) at a non-zero standby voltage level when the power amplifier(s) is inactive. When the power amplifier(s) becomes active and the time-variant voltage(s) needs to be raised or reduced from the non-zero standby voltage level, the rush current will be smaller as a result of reduced variation in the time-variant voltage(s). As such, it is possible to prolong the battery life in a device employing the power management circuit.

20 Claims, 6 Drawing Sheets

(56) References Cited

U.S. PATENT DOCUMENTS

| | | | |
|---|---|---|---|
| 9,020,453 B2 | 4/2015 | Briffa et al. | |
| 9,069,365 B2 | 6/2015 | Brown et al. | |
| 9,148,090 B2 | 9/2015 | Tsuji | |
| 9,172,331 B2 | 10/2015 | Nagasaku et al. | |
| 9,231,527 B2 | 1/2016 | Hur et al. | |
| 9,350,299 B2 | 5/2016 | Isuji | |
| 9,356,760 B2 | 5/2016 | Larsson et al. | |
| 9,391,567 B2 | 7/2016 | Kaczman | |
| 9,407,476 B2 | 8/2016 | Lim et al. | |
| 9,496,828 B2 | 11/2016 | Ye | |
| 9,560,595 B2 | 1/2017 | Dakshinamurthy et al. | |
| 9,590,563 B2 | 3/2017 | Wimpenny | |
| 9,614,477 B1 | 4/2017 | Rozenblit et al. | |
| 9,634,560 B2 | 4/2017 | Ek | |
| 10,097,145 B1 | 10/2018 | Khlat et al. | |
| 10,103,926 B1 | 10/2018 | Khlat | |
| 10,142,074 B2 | 11/2018 | Wang et al. | |
| 10,243,524 B2 | 3/2019 | Orr | |
| 10,326,408 B2 | 6/2019 | Khlat et al. | |
| 10,476,437 B2 | 11/2019 | Nag et al. | |
| 10,778,094 B2 | 9/2020 | de Cremoux | |
| 10,862,428 B2 * | 12/2020 | Henzler | H03F 3/189 |
| 10,998,859 B2 | 5/2021 | Khlat | |
| 11,018,627 B2 | 5/2021 | Khlat | |
| 11,018,638 B2 | 5/2021 | Khlat et al. | |
| 11,088,660 B2 | 8/2021 | Lin et al. | |
| 11,223,325 B2 | 1/2022 | Drogi et al. | |
| 11,349,513 B2 | 5/2022 | Khlat et al. | |
| 11,569,783 B2 | 1/2023 | Nomiyama et al. | |
| 2003/0099230 A1 | 5/2003 | Wenk | |
| 2004/0179382 A1 | 9/2004 | Thaker et al. | |
| 2011/0109393 A1 * | 5/2011 | Adamski | H03F 3/3028 330/124 R |
| 2012/0068767 A1 * | 3/2012 | Henshaw | H03F 1/0277 330/127 |
| 2013/0141063 A1 | 6/2013 | Kay et al. | |
| 2013/0141068 A1 | 6/2013 | Kay et al. | |
| 2014/0055197 A1 | 2/2014 | Khlat et al. | |
| 2014/0097895 A1 | 4/2014 | Khlat et al. | |
| 2014/0232458 A1 | 8/2014 | Arno et al. | |
| 2014/0312710 A1 | 10/2014 | Li | |
| 2014/0315504 A1 | 10/2014 | Sakai et al. | |
| 2014/0361837 A1 | 12/2014 | Strange et al. | |
| 2016/0094192 A1 | 3/2016 | Khesbak et al. | |
| 2016/0241208 A1 * | 8/2016 | Lehtola | H03F 1/0266 |
| 2016/0294587 A1 | 10/2016 | Jiang et al. | |
| 2017/0331433 A1 | 11/2017 | Khlat | |
| 2018/0234011 A1 | 8/2018 | Muramatsu et al. | |
| 2018/0257496 A1 | 9/2018 | Andoh et al. | |
| 2018/0278213 A1 | 9/2018 | Henzler et al. | |
| 2018/0351454 A1 | 12/2018 | Khesbak et al. | |
| 2019/0068234 A1 | 2/2019 | Khlat et al. | |
| 2019/0109566 A1 | 4/2019 | Folkmann et al. | |
| 2019/0181813 A1 | 6/2019 | Maxim et al. | |
| 2019/0222175 A1 | 7/2019 | Khlat et al. | |
| 2019/0288645 A1 | 9/2019 | Nag et al. | |
| 2019/0334750 A1 | 10/2019 | Nomiyama et al. | |
| 2019/0356285 A1 | 11/2019 | Khlat et al. | |
| 2020/0076297 A1 | 3/2020 | Nag et al. | |
| 2020/0127612 A1 | 4/2020 | Khlat et al. | |
| 2020/0136575 A1 | 4/2020 | Khlat et al. | |
| 2020/0204422 A1 | 6/2020 | Khlat | |
| 2020/0212796 A1 | 7/2020 | Murphy et al. | |
| 2020/0228063 A1 | 7/2020 | Khlat | |
| 2020/0266766 A1 | 8/2020 | Khlat et al. | |
| 2020/0295708 A1 | 9/2020 | Khlat | |
| 2020/0321917 A1 | 10/2020 | Nomiyama et al. | |
| 2020/0336105 A1 | 10/2020 | Khlat | |
| 2020/0336111 A1 | 10/2020 | Khlat | |
| 2020/0382061 A1 | 12/2020 | Khlat | |
| 2020/0382062 A1 | 12/2020 | Khlat | |
| 2020/0389132 A1 | 12/2020 | Khlat et al. | |
| 2021/0036604 A1 | 2/2021 | Khlat et al. | |
| 2021/0126599 A1 | 4/2021 | Khlat et al. | |
| 2021/0175798 A1 | 6/2021 | Liang | |
| 2021/0184708 A1 | 6/2021 | Khlat | |
| 2021/0194517 A1 | 6/2021 | Mirea et al. | |
| 2021/0226585 A1 | 7/2021 | Khlat | |
| 2021/0257971 A1 | 8/2021 | Kim et al. | |
| 2021/0265953 A1 | 8/2021 | Khlat | |
| 2022/0029614 A1 | 1/2022 | Khlat | |
| 2022/0037982 A1 | 2/2022 | Khlat et al. | |
| 2022/0052655 A1 | 2/2022 | Khalt | |
| 2022/0057820 A1 | 2/2022 | Khlat et al. | |
| 2022/0066487 A1 | 3/2022 | Khlat | |
| 2022/0069788 A1 | 3/2022 | King et al. | |
| 2022/0123744 A1 | 4/2022 | Khlat | |
| 2022/0224364 A1 | 7/2022 | Kim et al. | |
| 2022/0271714 A1 | 8/2022 | Khlat | |

OTHER PUBLICATIONS

U.S. Appl. No. 17/217,594, filed Mar. 30, 2021.

U.S. Appl. No. 17/217,654, filed Mar. 30, 2021.

Notice of Allowance for U.S. Appl. No. 17/325,482, dated Nov. 30, 2022, 8 pages.

Final Office Action for U.S. Appl. No. 17/408,899, dated Dec. 27, 2022, 13 pages.

International Search Report and Written Opinion for International Patent Application No. PCT/US2021/044596, dated Apr. 21, 2022, 13 pages.

Written Opinion for International Patent Application No. PCT/US2021/044596, dated Jun. 10, 2022, 6 pages.

International Preliminary Report on Patentability for International Patent Application No. PCT/US2021/044596, dated Sep. 1, 2022, 19 pages.

Notice of Allowance for U.S. Appl. No. 17/182,539, dated Sep. 14, 2022, 7 pages.

Notice of Allowance for U.S. Appl. No. 17/217,654, dated Oct. 12, 2022, 8 pages.

Notice of Allowance for U.S. Appl. No. 17/218,904, dated Aug. 26, 2022, 9 pages.

Final Office Action for U.S. Appl. No. 17/325,482, dated Aug. 16, 2022, 12 pages.

Advisory Action for U.S. Appl. No. 17/325,482, dated Oct. 14, 2022, 3 pages.

Non-Final Office Action for U.S. Appl. No. 17/408,899, dated Aug. 29, 2022, 13 pages.

Written Opinion for International Patent Application No. PCT/US2021/061721, dated Sep. 9, 2022, 7 pages.

International Preliminary Report on Patentability for International Patent Application No. PCT/US2021/061721, dated Apr. 4, 2023, 21 pages.

Paek, J.S. et al., "15.2 A 90ns/V Fast-Transition Symbol-Power-Tracking Buck Converter for 5G mm-Wave Phased-Array Transceiver," 2019 IEEE International Solid-State Circuits Conference, Feb. 2019, San Francisco, CA, USA, IEEE, 3 pages.

Notice of Allowance for U.S. Appl. No. 17/217,594, dated Apr. 3, 2023, 7 pages.

Notice of Allowance for U.S. Appl. No. 17/408,899, dated Feb. 24, 2023, 9 pages.

Non-Final Office Action for U.S. Appl. No. 17/942,472, dated Feb. 16, 2023, 13 pages.

Extended European Search Report for European Patent Application No. 22195683.2, dated Feb. 10, 2023, 12 pages.

Written Opinion for International Patent Application No. PCT/US2021/061721, dated Mar. 1, 2023, 7 pages.

Extended European Search Report for European Patent Application No. 22200302.2, dated Mar. 1, 2023, 14 pages.

Extended European Search Report for European Patent Application No. 22200322.0, dated Mar. 1, 2023, 13 pages.

Extended European Search Report for European Patent Application No. 22200300.6, dated Feb. 24, 2023, 10 pages.

Extended European Search Report for European Patent Application No. 22200111.7, dated Feb. 20, 2023, 9 pages.

Non-Final Office Action for U.S. Appl. No. 17/217,654, dated Jul. 1, 2022, 9 pages.

(56) References Cited

OTHER PUBLICATIONS

Non-Final Office Action for U.S. Appl. No. 17/218,904, dated May 25, 2022, 14 pages.
Notice of Allowance for U.S. Appl. No. 17/315,652, dated Jun. 20, 2022, 8 pages.
Mellon, L., "Data Transmission—Parallel vs Serial," Jul. 10, 2017, https://www.quantil.com/content-delivery-insights/content-acceleration/data-transmission/, 4 pages.
Non-Final Office Action for U.S. Appl. No. 17/237,244, dated Sep. 20, 2021, 14 pages.
Non-Final Office Action for U.S. Appl. No. 17/325,482, dated Sep. 30, 2021, 10 pages.
Notice of Allowance for U.S. Appl. No. 17/237,244, dated Jan. 27, 2022, 8 pages.
Non-Final Office Action for U.S. Appl. No. 17/325,482, dated Mar. 15, 2022, 10 pages.
Non-Final Office Action for U.S. Appl. No. 17/315,652, dated Feb. 14, 2022, 12 pages.
International Search Report and Written Opinion for International Patent Application No. PCT/US2021/061721, dated Mar. 14, 2022, 13 pages.
Non-Final Office Action for U.S. Appl. No. 17/315,652, dated Sep. 2, 2021, 7 pages.
Final Office Action for U.S. Appl. No. 17/942,472, dated Jul. 19, 2023, 15 pages.
Advisory Action Action for U.S. Appl. No. 17/942,472, dated Sep. 15, 2023, 3 pages.
Notice of Allowance for U.S. Appl. No. 17/942,472, dated Oct. 18, 2023, 10 pages.
Corrected Notice of Allowability for U.S. Appl. No. 17/942,472, dated Nov. 17, 2023, 5 pages.

\* cited by examiner

POWER MANAGEMENT CIRCUIT OPERABLE TO REDUCE RUSH CURRENT

RELATED APPLICATIONS

This application claims the benefit of provisional patent application Ser. No. 63/051,932, filed Jul. 15, 2020, the disclosure of which is hereby incorporated herein by reference in its entirety.

FIELD OF THE DISCLOSURE

The technology of the disclosure relates generally to a power management circuit.

BACKGROUND

Fifth-generation (5G) new radio (NR) (5G-NR) has been widely regarded as the next generation of wide-area wireless communication technology beyond the current third-generation (3G) and fourth-generation (4G) technologies. In this regard, a wireless communication device capable of supporting the 5G-NR wireless communication technology is expected to achieve higher data rates, improved coverage range, enhanced signaling efficiency, and reduced latency across a wide range of radio frequency (RF) bands, which include a low-band (below 1 GHz), a mid-band (1 GHz to 6 GHz), and a high-band (above 24 GHz). Moreover, the wireless communication device may still support the legacy 3G and 4G technologies for backward compatibility.

In addition, the wireless communication device is also required to support local area networking technologies, such as Wi-Fi, in both 2.4 GHz and 5 GHz bands. The latest 802.11ax standard has introduced a dynamic power control feature to allow the wireless communication device to transmit a Wi-Fi signal with a maximum power ranging from −10 dBm to 23 dBm. Accordingly, a Wi-Fi power amplifier(s) in the wireless communication device must be able to adapt a power level of the Wi-Fi signal on a per-frame basis. As a result, a power management circuit must be able to adapt an average power tracking (APT) voltage supplied to the Wi-Fi power amplifier(s) within Wi-Fi inter-frame spacing (IFS) to help maintain linearity and efficiency of the Wi-Fi power amplifier(s).

The Wi-Fi IFS may only last sixteen microseconds (16 µs). Depending on specific configurations of the Wi-Fi system, such as bandwidth mode, trigger frame format, modulation and coding scheme (MCS), and delays associated with Wi-Fi physical layer (PHY) and communication buses, the actual temporal limit for the power management circuit to adapt the APT voltage(s) may be as short as one-half of a microsecond (0.5 µs). In this regard, it is desirable for the power management circuit to adapt the APT voltage(s) from one level to another within a defined temporal limit (e.g., 0.5 µs).

Furthermore, the wireless communication device may also support such internet-of-things (IoT) applications as keyless car entry, remote garage door opening, contactless payment, mobile boarding pass, and so on. Needless to say, the wireless communication device must also always make 911/E911 service accessible under emergency situations. As such, it is critical that the wireless communication device remains operable whenever needed.

Notably, the wireless communication device relies on a battery cell (e.g., Li-Ion battery) to power its operations and services. Despite recent advancement in battery technologies, the wireless communication device can run into a low battery situation from time to time. In this regard, it is desirable to prolong battery life concurrent to enabling fast APT voltage changes in the wireless communication device.

SUMMARY

Embodiments of the disclosure relate to a power management circuit operable to reduce rush current. The power management circuit is configured to provide a time-variant voltage(s) to a power amplifier(s) for amplifying a radio frequency (RF) signal(s). To enable such technologies as dynamic power control, the power management circuit may be required to make a large variation of the time-variant voltage(s) (e.g., from 0 V to 5 V) within a defined temporal limit (e.g., 0.5 µs). Understandably, the large variation of the time-variant voltage(s) may cause a rush current that is proportionally related to the variation of the time-variant voltage(s). Given that the rush current can have a negative impact on battery life, it is desirable to reduce the rush current amid large variations of the time-variant voltage(s). In this regard, the power management circuit is configured to maintain the time-variant voltage(s) at a non-zero standby voltage level (e.g., 2.5 V) when the power amplifier(s) is inactive. As such, when the power amplifier(s) becomes active and the time-variant voltage(s) needs to be raised (e.g., to 5 V) or reduced (e.g., to 0 V) from the non-zero standby voltage level, the rush current will be smaller as a result of a reduced variation in the time-variant voltage(s). As such, it is possible to prolong the battery life in a device employing the power management circuit.

In one aspect, a power management circuit is provided. The power management circuit includes a number of voltage outputs each outputting a respective one of a number of time-variant voltages to a respective one of a number of power amplifiers for amplifying a respective one of a number of signals. The power management circuit also includes a voltage circuit configured to generate a first reference voltage and a second reference voltage based on a battery voltage. The power management circuit also includes a first voltage driver circuit coupled between the voltage circuit and the number of voltage outputs and configured to generate the number of time-variant voltages based on the first reference voltage. The power management circuit also includes a second voltage driver circuit coupled between the voltage circuit and the number of voltage outputs and configured to generate the number of time-variant voltages based on the second reference voltage. The power management circuit also includes a control circuit configured to cause the first voltage driver circuit to maintain the number of time-variant voltages at a non-zero standby voltage level in response to determining that each of the plurality of power amplifiers is inactive.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
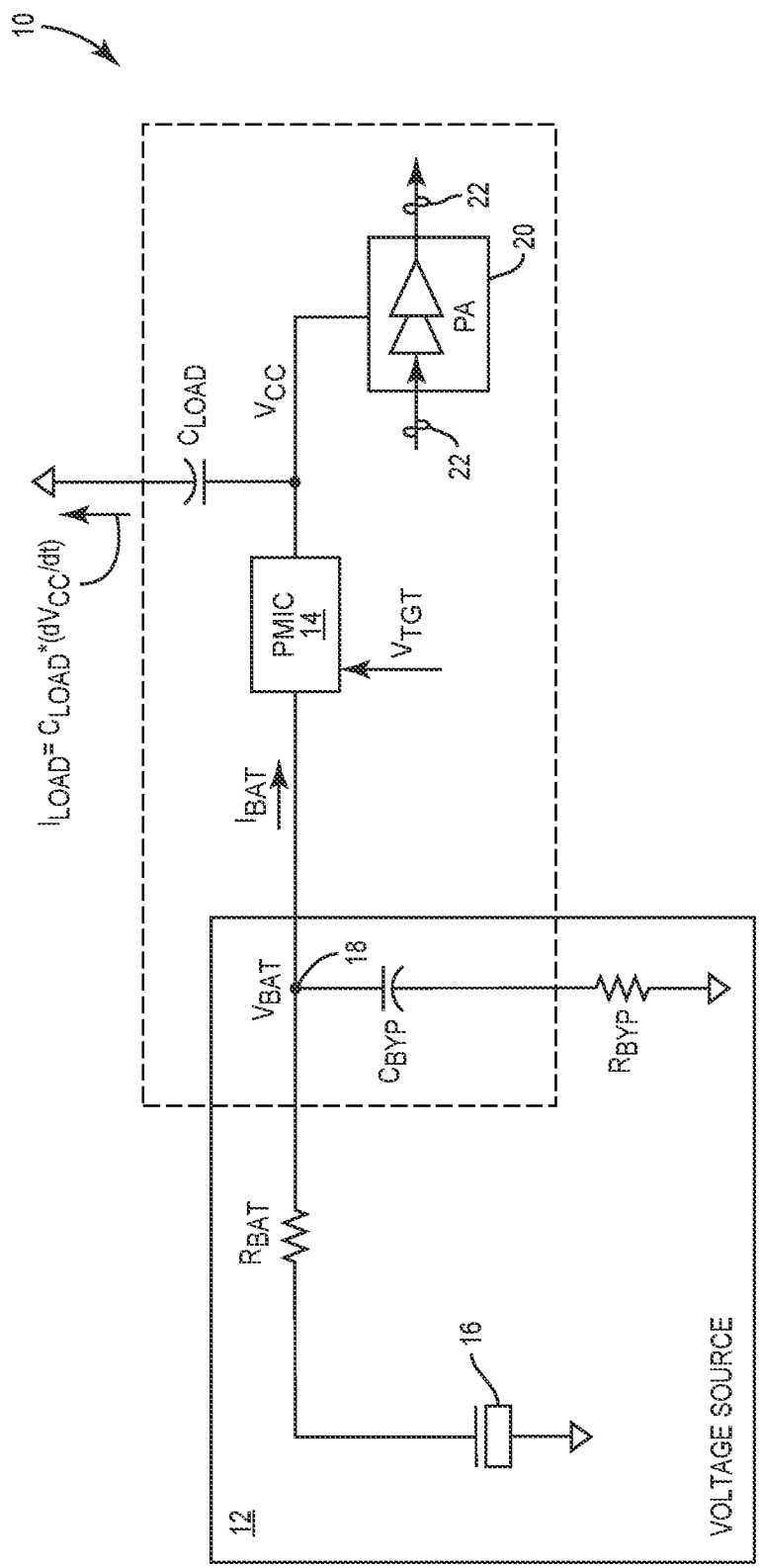
FIG. 1A is a schematic diagram of an exemplary conventional power management circuit that may fail to operate under a low battery condition.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a power management circuit operable to reduce rush current. The power management circuit is configured to provide a time-variant voltage(s) to a power amplifier(s) for amplifying a radio frequency (RF) signal(s). To enable such technologies as dynamic power control, the power management circuit may be required to make a large variation of the time-variant voltage(s) (e.g., from 0 V to 5 V) within a defined temporal limit (e.g., 0.5 μs). Understandably, the large variation of the time-variant voltage(s) may cause a rush current that is proportionally related to the variation of the time-variant voltage(s). Given that the rush current can have a negative impact on battery life, it is desirable to reduce the rush current amid large variations of the time-variant voltage(s). In this regard, the power management circuit is configured to maintain the time-variant voltage(s) at a non-zero standby voltage level (e.g., 2.5 V) when the power amplifier(s) is inactive. As such, when the power amplifier(s) becomes active and the time-variant voltage(s) needs to be raised (e.g., to 5 V) or reduced (e.g., to 0 V) from the non-zero standby voltage level, the rush current will be smaller as a result of a reduced variation in the time-variant voltage(s). As such, it is possible to prolong the battery life in a device employing the power management circuit.

Figure 1B:
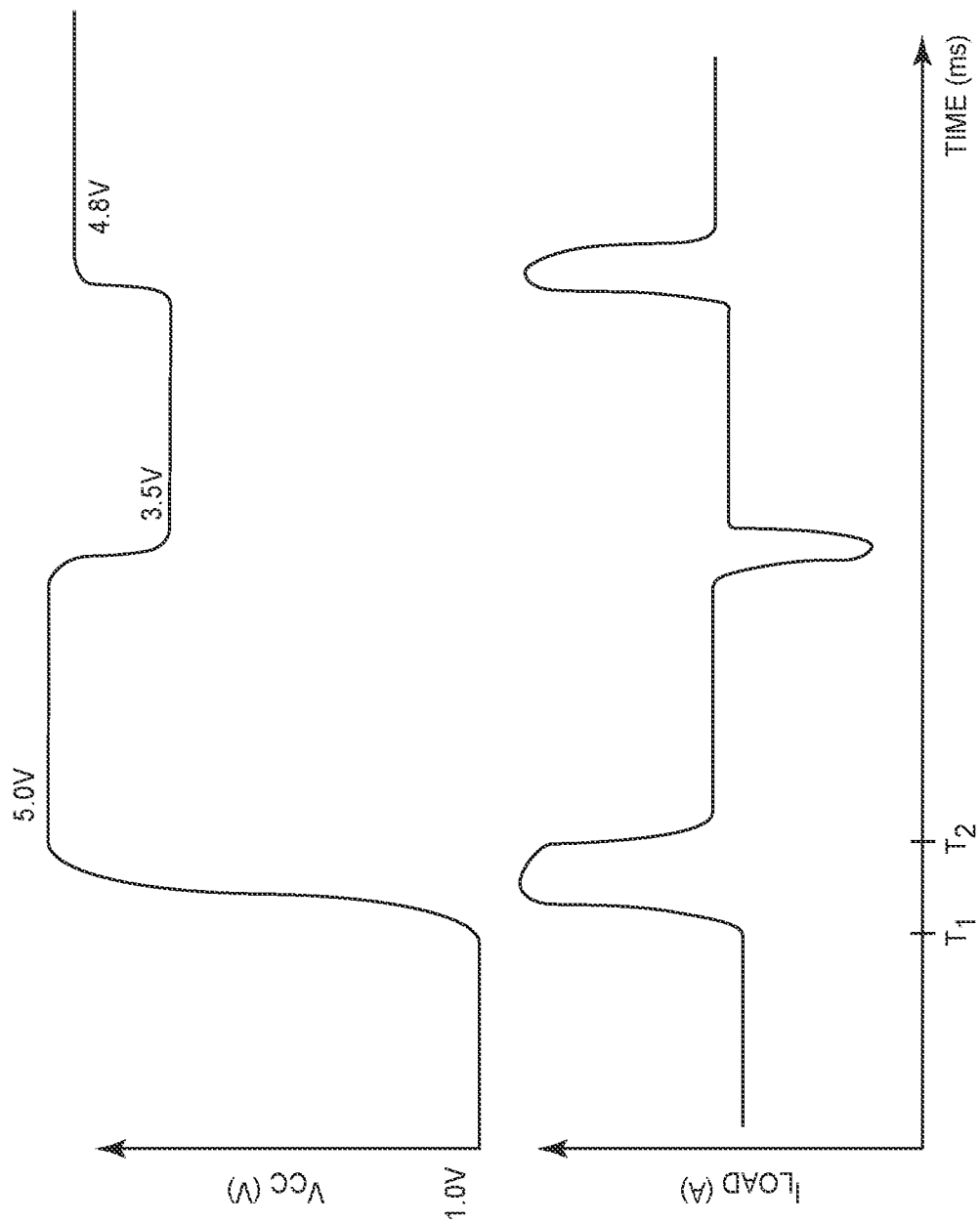
FIG. 1B is a graphic diagram providing an exemplary illustration of a rush current drawn from a voltage source in the conventional power management circuit of FIG. 1A as a result of changes of a time-variant voltage.
Figure 1C:
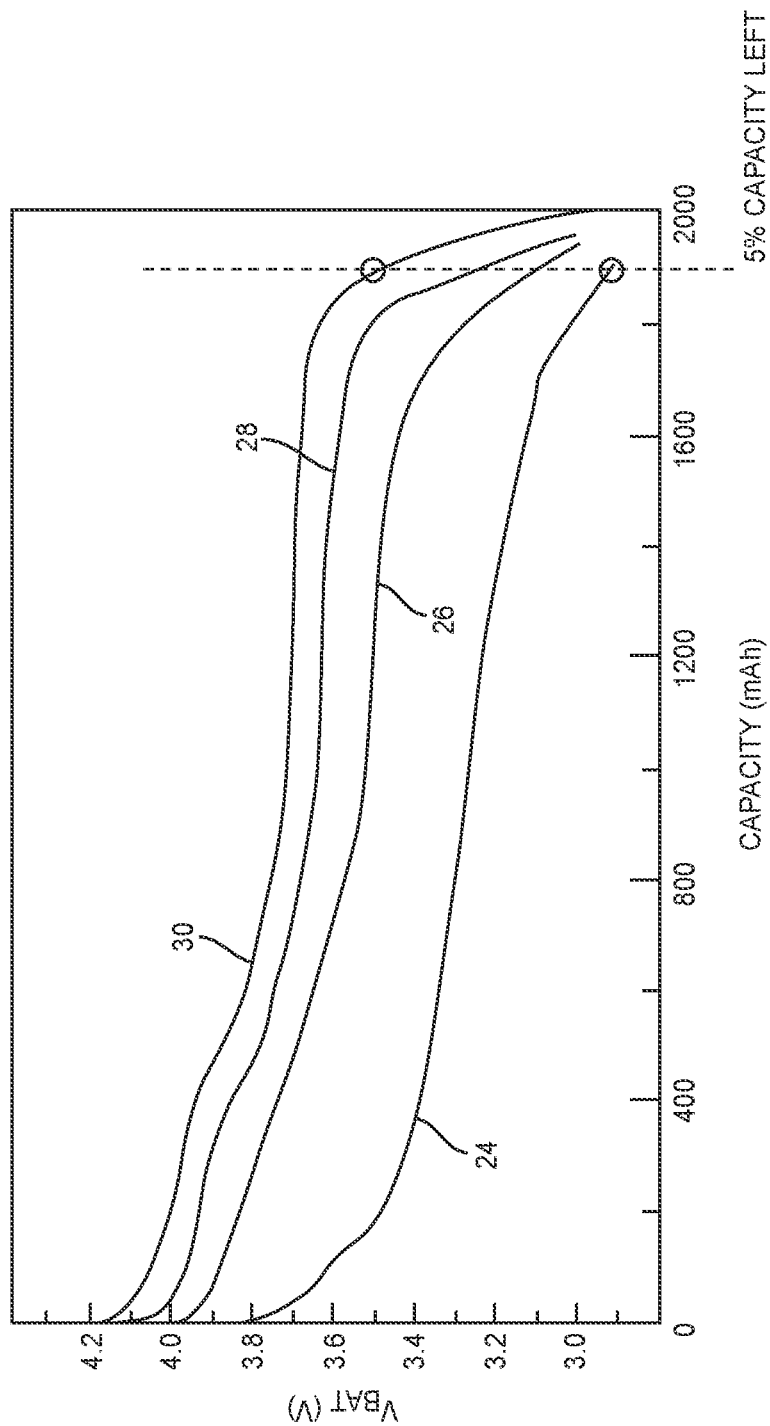
FIG. 1C is a graphic diagram providing an exemplary illustration as to how the rush current in FIG. 1B can cause the conventional power management circuit of FIG. 1A to fail to operate under a low battery condition.
Figure 2:
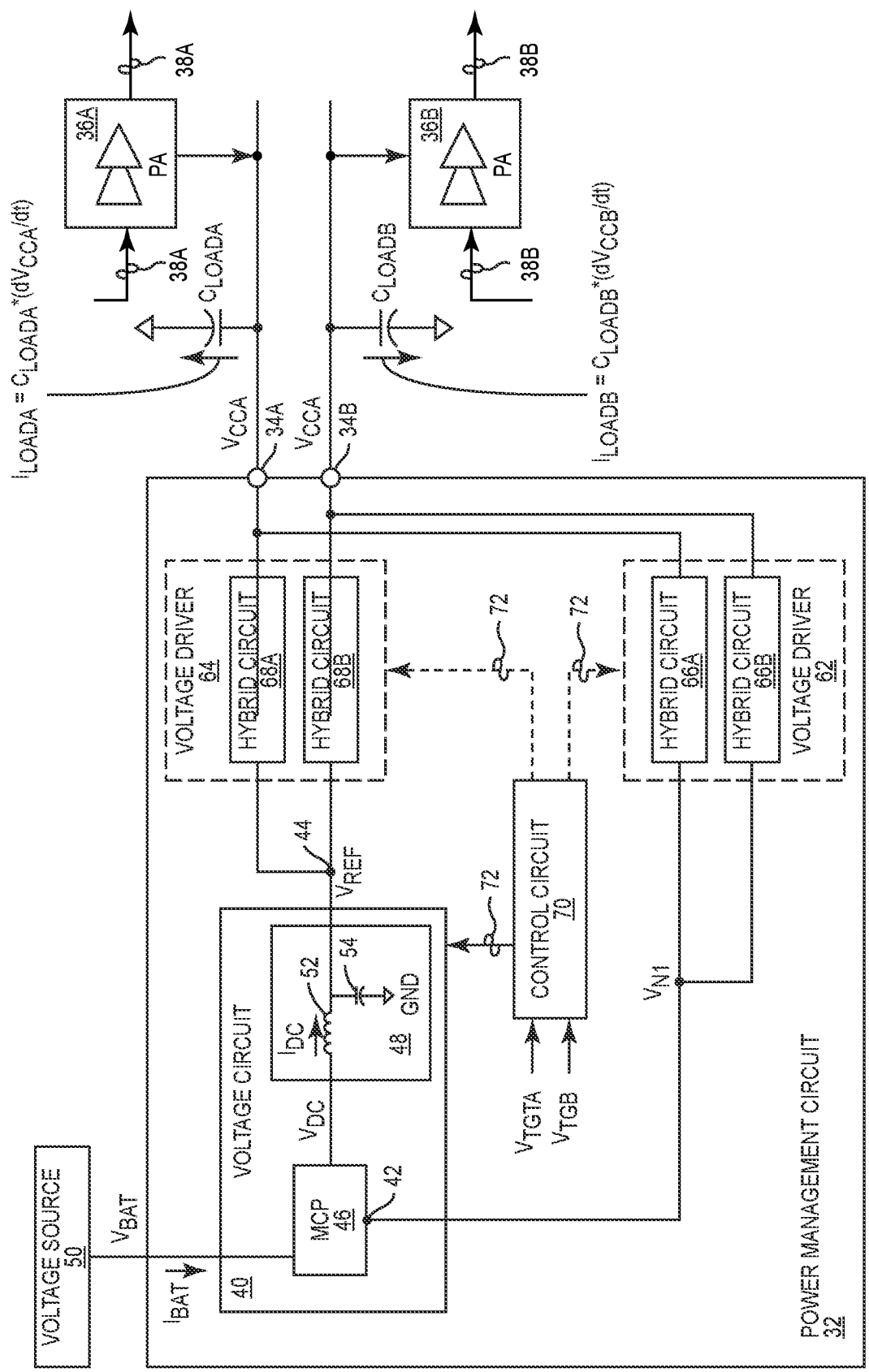
FIG. 2 is a schematic diagram of an exemplary power management circuit configured according to embodiments of the present disclosure to reduce a rush current.

Before discussing the power management circuit operable with reduced rush current according to the present disclosure, starting at FIG. 2, an overview of a conventional power management circuit that may fail to operate with low battery is first provided with reference to FIGS. 1A-1C.

FIG. 1A is a schematic diagram of an exemplary conventional power management circuit 10 that may fail to operate under a low battery condition. The conventional power management circuit 10 includes a voltage source 12 and a power management integrated circuit (PMIC) 14. The voltage source 12 includes a voltage source 16 (e.g., a Li-Ion battery) that supplies a battery voltage $V_{BAT}$ at a coupling node 18. The PMIC 14 is coupled to the coupling node 18 to receive the battery voltage $V_{BAT}$ and draw a battery current $I_{BAT}$. Accordingly, the PMIC 14 is configured to generate a time-variant voltage $V_{CC}$ based on the battery voltage $V_{BAT}$ and provide the time-variant voltage $V_{CC}$ to a power amplifier circuit 20 for amplifying a radio frequency (RF) signal 22.

The RF signal 22 may be modulated across a wide modulation bandwidth, which can cause a large variation of RF current at the power amplifier 20. As such, it is necessary to present a low impedance to the power amplifier circuit 20 to help reduce ripple in the voltage $V_{CC}$ caused by the RF current. In this regard, the conventional power management circuit 10 typically includes a large capacitor $C_{LOAD}$ to help reduce the impedance seen by the power amplifier circuit 20.

To avoid amplitude clipping to the RF signal 22 and improve efficiency of the power amplifier 20, the PMIC 14 is configured to generate the time-variant voltage $V_{CC}$ in accordance with a time-variant target voltage $V_{TGT}$ that tracks amplitude variations of the RF signal 22. In this regard, the time-variant voltage $V_{CC}$ can swing from low to high, or vice versa, from time to time. Notably, the capacitor $C_{LOAD}$ will draw a rush current $I_{LOAD}$ whenever the time-variant voltage $V_{CC}$ changes. Hereinafter, the rush current $I_{LOAD}$ refers to an electrical current drawn by the capacitor $C_{LOAD}$ from the voltage source 16 due to variation of the voltage $V_{CC}$.

As shown in the equation (Eq. 1) below, the rush current $I_{LOAD}$ may depend on a capacitance of the capacitor $C_{LOAD}$ and a rate at which the time-variant voltage $V_{CC}$ changes.

$$I_{LOAD}=C_{LOAD}*(dV_{CC}/dt) \quad \text{(Eq. 1)}$$

The rush current $I_{LOAD}$ as expressed in the equation (Eq. 1) can be illustrated graphically. In this regard, FIG. 1B is a graphic diagram providing an exemplary illustration of the rush current $I_{LOAD}$ in the conventional power management circuit 10 of FIG. 1A as a result of changes of the time-variant voltage $V_{CC}$.

For example, when the time-variant voltage $V_{CC}$ changes from 1 V to 5 V within 0.1 to 1 μs (between time $T_1$ and $T_2$) and the capacitance of the large capacitor $C_{LOAD}$ is 2.2 μF, the rush current $I_{LOAD}$ can be very high. As shown in FIG. 1C below, the high rush current $I_{LOAD}$ can negatively impact operability of the conventional power management circuit 10, especially when the voltage source 12 is at a lower battery capacity (e.g., <5%). In this regard, FIG. 1C is a graphic diagram providing an exemplary illustration as to how the rush current $I_{LOAD}$ in FIG. 1B can cause the conventional power management circuit 10 of FIG. 1A to fail to operate under a low battery condition.

FIG. 1C illustrates four different capacity change curves 24, 26, 28, and 30 corresponding to four different levels of the rush current $I_{LOAD}$. Among them, the capacity change curve 24 corresponds to a highest rush current $I_{LOAD}$ (e.g., 4 A) and the capacity change curve 30 corresponds to a lowest rush current $I_{LOAD}$ (e.g., 0.4 A). As illustrated, when the voltage source 12 is at 5% battery capacity, the highest rush current $I_{LOAD}$ can reduce the battery voltage $V_{BAT}$ by approximately 0.6 V relative to the lowest rush current $I_{LOAD}$.

The further reduction in the battery voltage $V_{BAT}$ resulting from the higher rush current $I_{LOAD}$ may negatively impact battery life of a wireless communication device (e.g., smartphone) employing the conventional power management circuit 10. As a result, the wireless communication device may run out of battery quicker than expected and become inoperable to support many critical applications (e.g., 911/E911). As such, it is desirable to reduce the rush current $I_{LOAD}$ to help prolong battery life in the wireless communication device.

In this regard, FIG. 2 is a schematic diagram of an exemplary power management circuit 32 configured according to various embodiments of the present disclosure to reduce a rush current $I_{LOAD}$. The power management circuit 32 includes a number of voltage outputs 34A, 34B that are coupled to a number of power amplifiers 36A, 36B, respectively. In examples disclosed herein, the voltage outputs 34A, 34B each output a respective one of a number of time-variant voltages $V_{CCA}$, $V_{CCB}$ to a respective one of the power amplifiers 36A, 36B for amplifying a respective one of a number of signals 38A, 38B.

The signals 38A, 38B may each be modulated with a wide modulation bandwidth (e.g., >200 MHz). In this regard, like the conventional power management circuit 10 of FIG. 1A, a pair of load capacitors $C_{LOADA}$, $C_{LOADB}$ are each employed to present a low impedance to a respective one of the power amplifiers 36A, 36B to help reduce ripples in a respective one of the time-variant voltages $V_{CCA}$, $V_{CCB}$. Similar to the large capacitor $C_{LOAD}$ in FIG. 1A, the load capacitor $C_{LOADA}$ will draw a respective rush current $I_{LOADA}$ when the first time-variant voltage $V_{CCA}$ changes. Similarly, the load capacitor $C_{LOADB}$ will draw a respective rush current $I_{LOADB}$ when the second time-variant voltage $V_{CCB}$ changes. The rush currents $I_{LOADA}$, $I_{LOADB}$ may be quantitively determined according to equations (Eq. 2.1 and 2.2) below.

$$I_{LOADA}=C_{LOADA}*(dV_{CCA}/dt) \quad \text{(Eq. 2.1)}$$

$$I_{LOADB}=C_{LOADB}*(dV_{CCB}/dt) \quad \text{(Eq. 2.2)}$$

According to previous discussions in FIGS. 1A-1C, the load currents $I_{LOADA}$, $I_{LOADB}$ can negatively impact battery life. As such, it is desirable to reduce the rush current $I_{LOADA}$, $I_{LOADB}$ concurrent to allowing instantaneous changes of the time-variant voltages $V_{CCA}$, $V_{CCB}$. Given that capacitances of the load capacitors $C_{LOADA}$, $C_{LOADB}$ are relatively fixed (e.g., 2.2 μF), it is thus clear from equations Eq. 2.1 and 2.2 that it is necessary to reduce magnitude of the voltage variations $dV_{CCA}$, $dV_{CCB}$ to help curb the rush currents $I_{LOADA}$, $I_{LOADB}$.

In this regard, in embodiments disclosed herein, the power management circuit 32 is configured to maintain the time-variant voltages $V_{CCA}$, $V_{CCB}$ at a non-zero standby voltage level when all of the power amplifiers 36A, 36B are determined to be inactive. In a non-limiting example, the non-zero standby voltage level can be so selected to equal to a minimum operating voltage among the of power amplifiers 36A, 36B. Herein, the minimum operating voltage refers to any of the time-variant voltages $V_{CCA}$, $V_{CCB}$ required by any of the power amplifiers 36A, 36B to amplify any of the signals 38A, 38B to a minimum power as required. For example, if the signal 38A is required to be amplified to a respective minimum power of 20 dBm and the signal 38B is required to be amplified to a respective minimum power of 21 dBm, the minimum operating voltage would correspond to the time-variant voltage $V_{CCA}$ required by the power amplifier 36A for amplifying the signal 38A to 20 dBm. In a non-limiting example, the non-zero standby voltage level can be higher than 0 V but lower than or equal to 2.5 V (>0V and ≤2.5 V).

By maintaining the time-variant voltages $V_{CCA}$, $V_{CCB}$ at the non-zero standby voltage level when the power amplifiers 36A, 36B are both inactive, it is possible to reduce any of the voltage variations $dV_{CCA}$, $dV_{CCB}$ when any of the power amplifiers 36A, 36B becomes active. For example, if the time-variant voltage $V_{CCA}$ has been maintained at 0 V when the power amplifier 36A becomes active and demands the time-variant voltage $V_{CCA}$ to rise to 5 V, then the $dV_{CCA}$ will be 5 V (5 V-0 V). In contrast, if the time-variant voltage $V_{CCA}$ has been maintained at the non-zero standby voltage level of 2.5 V, when the power amplifier 36A becomes active and demands the time-variant voltage $V_{CCA}$ to rise to 5 V, then the $dV_{CCA}$ will only be 2.5 V (5 V-2.5 V). As a result, the rush current $I_{LOADA}$ will be cut by half according to the equation (Eq. 2.1). Therefore, it is possible to prolong battery life in an electronic device (e.g., smartphone) that employs the power management circuit 32 and the power amplifiers 36A, 36B.

The power management circuit 32 includes a voltage circuit 40. In embodiments disclosed herein, the voltage circuit 40 is configured to generate a first reference voltage $V_{N1}$ at a first intermediate node 42 and a second reference voltage $V_{REF}$ at a reference node 44. The voltage circuit 40 includes a multi-level charge pump 46 (denoted as "MCP") and an inductor-capacitor (LC) circuit 48. The multi-level charge pump 46 is coupled to a voltage source 50 (e.g., a battery) to receive a battery voltage $V_{BAT}$ and a battery current $I_{BAT}$. The LC circuit 48 includes a power inductor 52 and a bypass capacitor 54. The power inductor 52 is coupled between the multi-level charge pump 46 and the reference node 44, while the bypass capacitor 54 is coupled between the reference node 44 and a ground (GND).

The multi-level charge pump 46 is configured to generate a low-frequency voltage $V_{DC}$ at multiple voltage levels based on the battery voltage $V_{BAT}$. In a non-limiting example, the multi-level charge pump 46 can operate in a buck mode to generate the low-frequency voltage $V_{DC}$ at or below the battery voltage $V_{BAT}$ ($V_{DC} \leq V_{BAT}$) or in a boost mode to generate the low-frequency voltage $V_{DC}$ at two times the battery voltage $V_{BAT}$ ($V_{DC} = 2V_{BAT}$).

The LC circuit 48 is configured to function as a low-pass filter.

Specifically, the power inductor 52 induces a respective low-frequency current IDC (e.g., a constant current) based on each of the multiple levels of the low-frequency voltage $V_{DC}$ to charge the bypass capacitor 54. Notably, the multi-level charge pump 46 may generate the low-frequency voltage $V_{DC}$ at different levels based on a selected duty cycle. Accordingly, the LC circuit 48 is configured to output the second reference voltage $V_{REF}$ at the reference node 44 as an average of the multiple voltage levels of the low-frequency voltage $V_{DC}$. For example, if the multi-level charge pump 46 is configured to generate the low-frequency voltage $V_{DC}$ at 1 V for 70% of the time and at 5 V for 30% of the time, then the LC circuit 48 will output the second reference voltage $V_{REF}$ at 2.2 V (1 V*70%+5 V*30%).

Figure 3A:
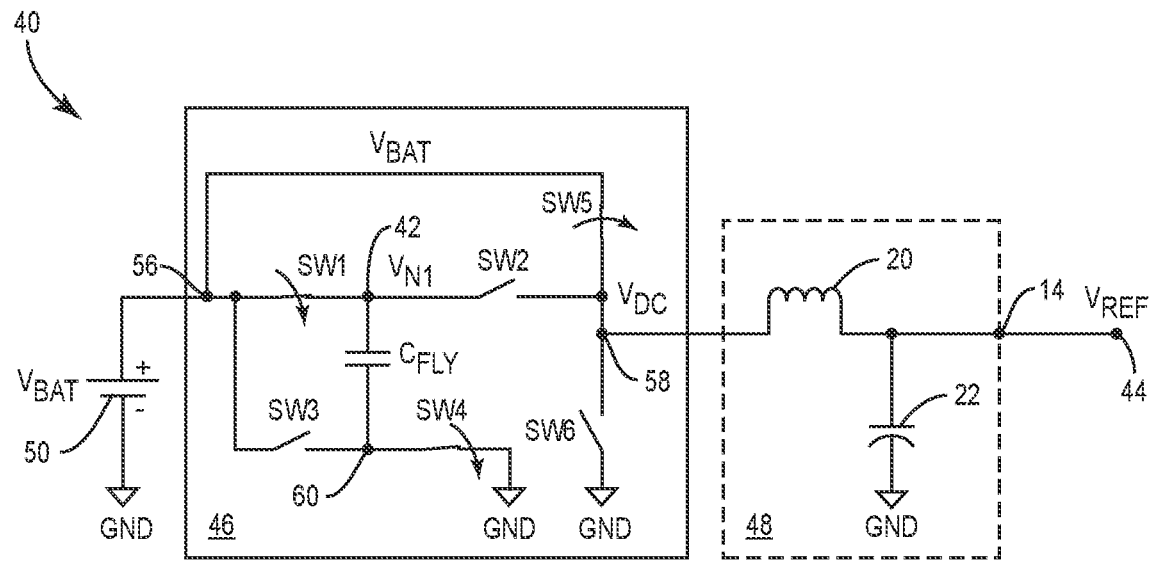
FIGS. 3A and 3B are schematic diagrams providing exemplary illustrations of different operating modes of a voltage circuit in the power management circuit of FIG. 2.
Figure 3B:
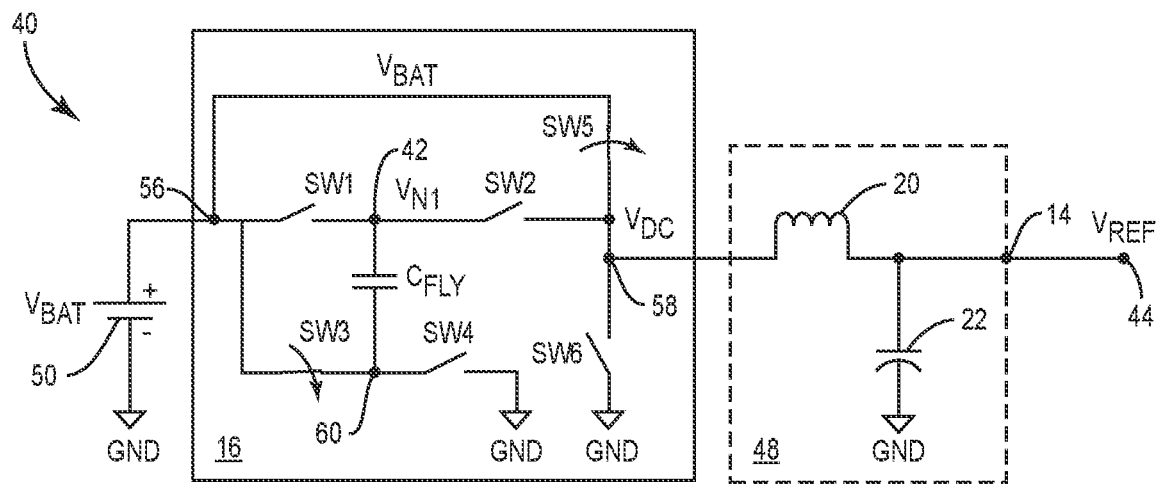

FIGS. 3A and 3B are schematic diagrams providing exemplary illustrations of different operating modes of the voltage circuit 40 in the power management circuit 32 of FIG. 2. Specifically, FIG. 3A illustrates an operating mode of the voltage circuit 40 that generates the first reference voltage $V_{N1}$ and the second reference voltage $V_{REF}$ that equals the battery voltage $V_{BAT}$. Common elements between FIGS. 2 and 3A are shown therein with common element numbers and will not be re-described herein.

The multi-level charge pump 46 includes an input node 56, an output node 58, the first intermediate node 42, and a second intermediate node 60. Specifically, the input node 56 is coupled to the voltage source 50 to receive the battery voltage $V_{BAT}$, and the output node 58 is coupled to the LC circuit 48 to output the low-frequency voltage $V_{DC}$. The multi-level charge pump 46 includes a first switch SW1, a second switch SW2, a third switch SW3, a fourth switch SW4, a fifth switch SW5, and a sixth switch SW6. The first switch SW1 is coupled between the input node 56 and the first intermediate node 42. The second switch SW2 is coupled between the first intermediate node 42 and the output node 58. The third switch SW3 is coupled between the input node 56 and the second intermediate node 60. The fourth switch SW4 is coupled between the second intermediate node 60 and the GND. The fifth switch SW5 is coupled between the input node 56 and the output node 58. The sixth switch SW6 is coupled between the output node 58 and the GND. The multi-level charge pump 46 also includes a fly capacitor $C_{FLY}$ that is coupled between the first intermediate node 42 and the second intermediate node 60.

To cause the voltage circuit 40 to output the first reference voltage $V_{N1}$ at the battery voltage $V_{BAT}$, the first switch SW1 and the fourth switch SW4 are closed. By closing the first switch SW1 and the fourth switch SW4, the fly capacitor $C_{FLY}$ is charged to thereby bring the first reference voltage $V_{N1}$ to equal the battery voltage $V_{BAT}$ at the first intermediate node 42. To further cause the voltage circuit 40 to output the second reference voltage $V_{REF}$ at the battery voltage $V_{BAT}$, the fifth switch SW5 is also closed. In this regard, the multi-level charge pump 46 outputs the battery voltage $V_{BAT}$ as the low-frequency voltage $V_{DC}$ with 100% duty cycle. Accordingly, the LC circuit 48 will output the battery voltage $V_{BAT}$ at the reference node 44 as the second reference voltage $V_{REF}$. In the meantime, the second switch SW2, the third switch SW3, and the sixth switch SW6 remain open.

FIG. 3B illustrates an operating mode of the voltage circuit 40 that generates the first reference voltage $V_{N1}$ higher than the battery voltage $V_{BAT}$ and the second reference voltage $V_{REF}$ at the battery voltage $V_{BAT}$. Common elements between FIGS. 2 and 3B are shown therein with common element numbers and will not be re-described herein.

To cause the voltage circuit 40 to output the first reference voltage $V_{N1}$ higher than the battery voltage $V_{BAT}$, the third switch SW3 is closed. In this regard, the first reference voltage $V_{N1}$ at the first intermediate node 42 may be higher than the battery voltage $V_{BAT}$, depending on how much the fly capacitor $C_{FLY}$ has been charged. For example, if the fly capacitor $C_{FLY}$ has been fully charged to the battery voltage $V_{BAT}$ (e.g., by closing the first switch SW1 and the fourth switch SW4), then the voltage circuit 40 will output the first reference voltage $V_{N1}$ at twice the battery voltage $V_{BAT}$ ($2 \times V_{BAT}$) when the third switch SW3 is closed.

To further cause the voltage circuit 40 to output the second reference voltage $V_{REF}$ at the battery voltage $V_{BAT}$, the fifth switch SW5 is also closed. In this regard, the multi-level charge pump 46 outputs the battery voltage $V_{BAT}$ as the low-frequency voltage $V_{DC}$ with 100% duty cycle. Accordingly, the LC circuit 48 will output the battery voltage $V_{BAT}$ at the reference node 44 as the second reference voltage $V_{REF}$. In the meantime, the first switch SW1, the second switch SW2, the fourth switch SW4, and the sixth switch SW6 remain open.

As further discussed below, the operating mode of the voltage circuit 40 as illustrated in FIG. 3A allows the power management circuit 32 to maintain the time-variant voltages $V_{CCA}$, $V_{CCB}$ at the non-zero standby voltage level when the power amplifiers 36A, 36B are both inactive. The operating mode of the voltage circuit 40 as illustrated in FIG. 3B allows the power management circuit 32 to quickly increase one or more of the time-variant voltages $V_{CCA}$, $V_{CCB}$ when one or more of the power amplifiers 36A, 36B become active.

With reference back to FIG. 2, the power management circuit 32 further includes a first voltage driver circuit 62 and a second voltage driver circuit 64. The first voltage driver circuit 62 includes a number of first hybrid circuits 66A, 66B each coupled between the first intermediate node 42 and a respective one of the voltage outputs 34A, 34B. The first hybrid circuits 66A, 66B can each be configured to operate as a closed switch, an open switch, or a low-dropout (LDO) regulator. When operating as the closed switch, each of the first hybrid circuits 66A, 66B will pass the first reference voltage $V_{N1}$ to the respective one of the voltage outputs 34A, 34B. When operating as the open switch, each of the first hybrid circuits 66A, 66B will block the first reference voltage $V_{N1}$ from the respective one of the voltage outputs 34A, 34B. When operating as the LDO regulator, each of the first hybrid circuits 66A, 66B will regulate (e.g., reduce) the first reference voltage $V_{N1}$ at the respective one of the voltage outputs 34A, 34B.

The second voltage driver circuit 64 includes a number of second hybrid circuits 68A, 68B each coupled between the reference node 44 and a respective one of the voltage outputs 34A, 34B. Similar to the first hybrid circuits 66A, 66B, the second hybrid circuits 68A, 68B can each be configured to operate as a closed switch, an open switch, or an LDO regulator. When operating as the closed switch, each of the second hybrid circuits 68A, 68B will pass the second reference voltage $V_{REF}$ to the respective one of the voltage outputs 34A, 34B. When operating as the open switch, each of the second hybrid circuits 68A, 68B will block the second reference voltage $V_{REF}$ from the respective one of the voltage outputs 34A, 34B. When operating as the LDO regulator, each of the second hybrid circuits 68A, 68B will regulate (e.g., reduce) the second reference voltage $V_{REF}$ at the respective one of the voltage outputs 34A, 34B.

The power management circuit 32 further includes a control circuit 70, which can be a field-programmable gate array (FPGA), as an example. The control circuit 70 may control the voltage circuit 40, the first voltage driver circuit 62, and the second voltage driver circuit 64 via at least one control signal 72. Specifically, the control circuit 70 may use the control signal 72 to cause the voltage circuit 40 to operate in one of the two operating modes as previously illustrated in FIGS. 3A and 3B. The control circuit 70 may also use the control signal 72 to cause any of the first hybrid circuits 66A, 66B and/or any of the second hybrid circuits 68A, 68B to operate as open switch, closed switch, or LDO regulator based on a determination as to whether any of the power amplifiers 36A, 36B is active.

Notably, when the power amplifiers 36A, 36B are active for amplifying the signals 38A, 38B, the control circuit 70 will receive a number of time-variant target voltages $V_{TGTA}$, $V_{TGTB}$ corresponding to the time-variant voltages $V_{CCA}$, $V_{CCB}$, respectively. In this regard, the control circuit 70 may determine that all of the power amplifiers 36A, 36B are inactive if the control circuit 70 does not receive any of the time-variant target voltages $V_{TGTA}$, $V_{TGTB}$. In contrast, if the control circuit 70 receives one or more of the time-variant target voltages $V_{TGTA}$, $V_{TGTB}$, the control circuit 70 can then determine that one or more of the power amplifiers 36A, 36B become active.

In response to determining that all of the power amplifiers 36A, 36B are inactive, the control circuit 70 can then control the voltage circuit 40 to operate in the operating mode as illustrated in FIG. 3A. In this regard, the voltage circuit 40 will generate each of the first reference voltage $V_{N1}$ and the second reference voltage $V_{REF}$ at the battery voltage $V_{BAT}$.

In a non-limiting example, the non-zero standby voltage level is so determined to be lower than the first reference voltage $V_{N1}$. As such, the control circuit 70 will configure each of the first hybrid circuits 66A, 66B to operate as and LDO regulator to regulate the first reference voltage $V_{N1}$ at the respective one of the voltage outputs 34A, 34B. In contrast, if the non-zero standby voltage level is so determined to be equal to the first reference voltage $V_{N1}$, the control circuit 70 will configure each of the first hybrid circuits 66A, 66B to operate as a closed switch to pass the first reference voltage $V_{N1}$ to the respective one of the voltage outputs 34A, 34B. In either case, the power management circuit 32 will draw little current from the voltage source 50, except for ambient current caused by the first hybrid circuits 66A, 66B. Regardless of how the non-zero standby voltage level is set, the control circuit 70 will control the second hybrid circuits 68A, 68B to each operate as an open switch to block the second reference voltage $V_{REF}$ from the respective one of the voltage outputs 34A, 34B.

If the control circuit 70 receives the time-variant target voltage $V_{TGTA}$ indicating that the time-variant voltage $V_{CCA}$ needs to rise to a first desired level (e.g., 5 V) higher than the non-zero standby voltage level (e.g., 2.5 V), it is an indication that the power amplifier 36A has become active. As such, the control circuit 70 needs to ensure that the time-variant voltage $V_{CCA}$ can rise from the non-zero standby voltage level to the first desired level within the defined temporal limit (e.g., 0.5 μs).

In this regard, in a non-limiting example, the control circuit 70 can cause the voltage circuit 40 to operate in the operating mode as illustrated in FIG. 3B to generate the first reference voltage $V_{N1}$ higher than the battery voltage $V_{BAT}$ (e.g., 2×$V_{BAT}$) to thereby raise the time-variant voltage $V_{CCA}$ to a first predefined level substantially close to the first desired level (e.g., 0.1 V below the first desired level) within the defined temporal limit. In the meantime, the control circuit 70 may further cause the voltage circuit 40 to generate the second reference voltage $V_{REF}$ higher than or equal to the battery voltage $V_{BAT}$. Understandably, given the power inductor 52 in the LC circuit 48, the second reference voltage $V_{REF}$ may ramp up slower than the first reference voltage $V_{N1}$.

Accordingly, the control circuit 70 may cause the first hybrid circuit 66A to operate as a closed switch to pass the first reference voltage $V_{N1}$ to the voltage output 34A. Concurrently, the control circuit 70 may cause the second hybrid circuit 68A to also operate as a closed switch to pass the second reference voltage $V_{REF}$ to the voltage output 34A. Collectively, the first reference voltage $V_{N1}$ and the second reference voltage $V_{REF}$ can ensure that the time-variant voltage $V_{CCA}$ will increase to the first predefined level substantially close to the first desired level within the defined temporal limit.

Once the time-variant voltage $V_{CCA}$ has reached the first predefined level substantially close to the first desired level, the control circuit 70 may control the first hybrid circuit 66A to instead operate as an open switch to block the first reference voltage $V_{N1}$ from the voltage output 34A. In the meantime, the second reference voltage $V_{REF}$ will cause the time-variant voltage $V_{CCA}$ to continue to increase until the time-variant voltage $V_{CCA}$ reaches the first desired level.

Concurrent to receiving the time-variant voltage $V_{TGTA}$, if the control circuit 70 does not receive the time-variant target voltage $V_{TGTB}$, the control circuit 70 can thus determine that the power amplifier 36B remains inactive. In this regard, in a non-limiting example, the control circuit 70 can cause the first hybrid circuit 66B to operate as an open switch to block the first reference voltage $V_{N1}$ from the voltage output 34B. Furthermore, the control circuit 70 may cause the second hybrid circuit 68B to also operate as an open switch to block the second reference voltage $V_{REF}$ from the voltage output 34B.

Subsequently, in a non-limiting example, when the control circuit 70 receives the time-variant target voltage $V_{TGTB}$ indicating that the time-variant voltage $V_{CCB}$ needs to rise to a second desired level higher than the non-zero standby voltage level, it is an indication that the power amplifier 36B has become active. As such, the control circuit 70 needs to ensure that the time-variant voltage $V_{CCB}$ can rise from the non-zero standby voltage level to the second desired level within the defined temporal limit (e.g., 0.5 µs).

In this regard, the control circuit 70 may cause the first hybrid circuit 66B to operate as a closed switch to pass the first reference voltage $V_{N1}$ to the voltage output 34B. Concurrently, the control circuit 70 may cause the second hybrid circuit 68B to also operate as a closed switch to pass the second reference voltage $V_{REF}$ to the voltage output 34B if the second desired level is higher than or equal to the first desired level. Otherwise, if the second desired level is lower than the first desired level, the control circuit 70 may cause the second hybrid circuit 68B to operate as an LDO regulator to regulate the second reference voltage $V_{REF}$ at the voltage output 34B. Collectively, the first reference voltage $V_{N1}$ and the second reference voltage $V_{REF}$ can ensure that the time-variant voltage $V_{CCB}$ will increase to the second predefined level substantially close to the second desired level within the defined temporal limit.

Once the time-variant voltage $V_{CCB}$ has reached the second predefined level substantially close to the second desired level, the control circuit 70 may control the first hybrid circuit 66B to instead operate as an open switch to block the first reference voltage $V_{N1}$ from the voltage output 34B. In the meantime, the second reference voltage $V_{REF}$ will cause the time-variant voltage $V_{CCB}$ to continue to increase until the time-variant voltage $V_{CCB}$ reaches the second desired level.

Figure 4:
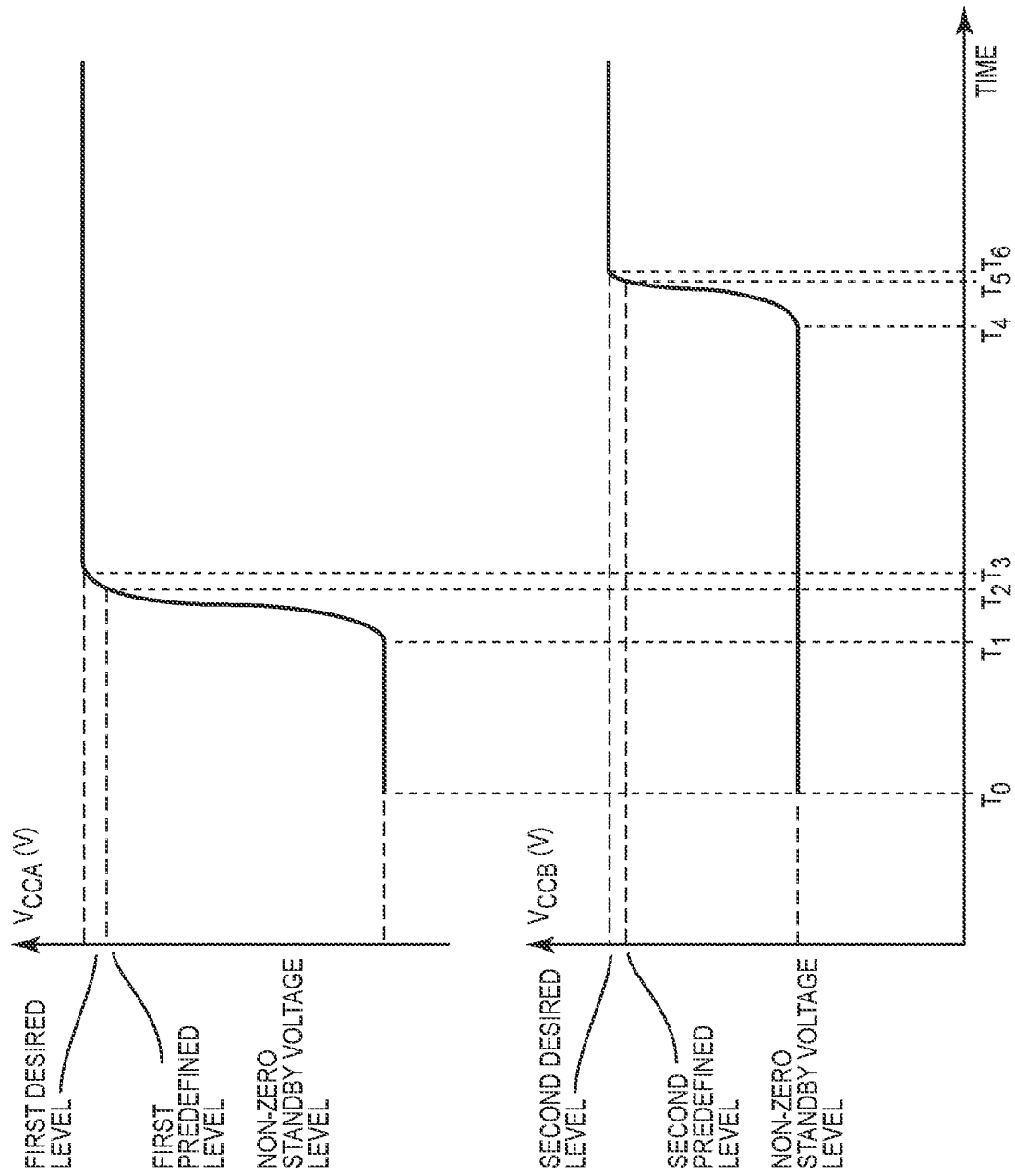
FIG. 4 is a graphic diagram providing an exemplary illustration of different operation scenarios of the power management circuit of FIG. 2.

FIG. 4 is a graphic diagram illustrating exemplary operation scenario of the power management circuit 32 of FIG. 2 as described above. Common elements between FIGS. 2 and 4 are shown therein with common element numbers and will not be re-described herein.

Prior to time $T_1$, the power amplifiers 36A, 36B are both inactive. Accordingly, the control circuit 70 causes the voltage circuit 40 to operate in the operating mode as described in FIG. 3A to maintain the time-variant voltages $V_{CCA}$, $V_{CCB}$ at the non-zero standby voltage level (e.g., 2.5 V).

At time $T_1$, the power amplifier 36A becomes active and the time-variant target voltage $V_{TGTA}$ indicates that the time-variant voltage $V_{CCA}$ needs to rise to the first desired level (e.g., 5 V), while the power amplifier 36B remains inactive. Accordingly, the control circuit 70 causes the voltage circuit 40 to operate in the operating mode as described in FIG. 3B to generate the first reference voltage $V_{N1}$ higher than the battery voltage $V_{BAT}$ and the second reference voltage $V_{REF}$ at or higher than the battery voltage $V_{BAT}$. The control circuit 70 further causes the first hybrid circuit 66A and the second hybrid circuit 68A to both operate as closed switches to pass the first reference voltage $V_{N1}$ and the second reference voltage $V_{REF}$ to the voltage output 34A.

At time $T_2$, the time-variant voltage $V_{CCA}$ reaches the first predefined level (e.g., 4.9 V) substantially close to the first desired level (e.g., 5 V). Therefore, the control circuit 70 causes the first hybrid circuit 66A to operate as an open switch to block the first reference voltage $V_{N1}$ from the voltage output 34A, while keeping the second hybrid circuit 68A to continue operating as the closed switch to thereby bring the time-variant voltage $V_{CCA}$ up to the first desired level at time $T_3$ and to maintain the time-variant voltage $V_{CCA}$ at the first desired level thereafter.

At time $T_4$, the power amplifier 36B becomes active and the time-variant target voltage $V_{TGTB}$ indicates that the time-variant voltage $V_{CCB}$ needs to rise to the second desired level (e.g., 4 V), while the power amplifier 36A remains active. Accordingly, the control circuit 70 causes the voltage circuit 40 to continue operating in the operating mode as described in FIG. 3B to generate the first reference voltage $V_{N1}$ higher than the battery voltage $V_{BAT}$ and the second reference voltage $V_{REF}$ at or higher than the battery voltage $V_{BAT}$. The control circuit 70 further causes the first hybrid circuit 66B to operate as closed switches to pass the first reference voltage $V_{N1}$ to the voltage output 34B. Given that the second desired level is lower than the first desired level, the control circuit will cause second hybrid circuit 68B to operate as an LDO regulator to regulate the second reference voltage $V_{REF}$ at the voltage output 34B.

At time $T_5$, the time-variant voltage $V_{CCB}$ reaches the second predefined level (e.g., 3.9 V) substantially close to the second desired level (e.g., 4 V). Therefore, the control circuit 70 causes the first hybrid circuit 66B to operate as an open switch to block the first reference voltage $V_{N1}$ from the voltage output 34B, while keeping the second hybrid circuit 68B to continue operating as the LDO regulator to thereby bring the time-variant voltage $V_{CCB}$ up to the second desired level at time $T_6$ and to maintain the time-variant voltage $V_{CCB}$ at the second desired level thereafter.

Those skilled in the art will recognize improvements and modifications to the preferred embodiments of the present disclosure. All such improvements and modifications are considered within the scope of the concepts disclosed herein and the claims that follow.

What is claimed is:
1. A power management circuit comprising:
a plurality of voltage outputs each outputting a respective one of a plurality of time-variant voltages to a respective one of a plurality of power amplifiers for amplifying a respective one of a plurality of signals;
a voltage circuit configured to generate a first reference voltage and a second reference voltage based on a battery voltage;
a first voltage driver circuit coupled between the voltage circuit and the plurality of voltage outputs and configured to generate the plurality of time-variant voltages based on the first reference voltage;
a second voltage driver circuit coupled between the voltage circuit and the plurality of voltage outputs and configured to generate the plurality of time-variant voltages based on the second reference voltage; and
a control circuit configured to cause the first voltage driver circuit to maintain the plurality of time-variant voltages at a non-zero standby voltage level in response to determining that each of the plurality of power amplifiers is inactive.

2. The power management circuit of claim 1 wherein the non-zero standby voltage level is lower than or equal to a minimum operating voltage among the plurality of power amplifiers.

3. The power management circuit of claim 1 wherein the voltage circuit comprises:

a multi-level charge pump configured to generate a low-frequency voltage at multiple levels based on the battery voltage and in accordance with a selected duty cycle; and an inductor-capacitor (LC) circuit coupled between the multi-level charge pump and a reference node and configured to average the multiple levels of the low-frequency voltage to generate the second reference voltage at the reference node.

4. The power management circuit of claim 3 wherein the multi-level charge pump comprises a first intermediate node that outputs the first reference voltage.

5. The power management circuit of claim 4 wherein the multi-level charge pump comprises:
an input node coupled to a voltage source to receive the battery voltage;
an output node coupled to the LC circuit to output the low-frequency voltage to the LC circuit;
a first switch coupled between the input node and the first intermediate node;
a second switch coupled between the first intermediate node and the output node;
a third switch coupled between the input node and a second intermediate node;
a fourth switch coupled between the second intermediate node and a ground;
a fifth switch coupled between the input node and the output node;
a sixth switch coupled between the reference node and the ground; and
a fly capacitor coupled between the first intermediate node and the second intermediate node.

6. The power management circuit of claim 5 wherein the control circuit is further configured to close the first switch and the fourth switch to cause the first reference voltage to be generated at the battery voltage at the first intermediate node.

7. The power management circuit of claim 6 wherein the control circuit is further configured to close the fifth switch to cause the multi-level charge pump to output the low-frequency voltage at the battery voltage to thereby cause the LC circuit to generate the second reference voltage at the battery voltage.

8. The power management circuit of claim 5 wherein the control circuit is further configured to close the third switch to cause the first reference voltage to be generated at higher than the battery voltage at the first intermediate node.

9. The power management circuit of claim 8 wherein the control circuit is further configured to close the fifth switch to cause the multi-level charge pump to output the low-frequency voltage at the battery voltage to thereby cause the LC circuit to generate the second reference voltage at the battery voltage.

10. The power management circuit of claim 4 wherein:
the first voltage driver circuit comprises a plurality of first hybrid circuits each coupled between the first intermediate node and a respective one of the plurality of voltage outputs, the plurality of first hybrid circuits is configured to:
operate as closed switches to pass the first reference voltage to the plurality of voltage outputs, respectively;
operate as open switches to block the first reference voltage from the plurality of voltage outputs, respectively; and
operate as low-dropout (LDO) regulators to regulate the first reference voltage at the plurality of voltage outputs, respectively; and
the second voltage driver circuit comprises a plurality of second hybrid circuits coupled between the reference node and a respective one of the plurality of voltage outputs, the plurality of second hybrid circuits is configured to:
operate as closed switches to pass the second reference voltage to the plurality of voltage outputs, respectively;
operate as open switches to block the second reference voltage from the plurality of voltage outputs, respectively; and
operate as LDO regulators to regulate the second reference voltage at the plurality of voltage outputs, respectively.

11. The power management circuit of claim 10 wherein, in response to determining that the plurality of power amplifiers is inactive, the control circuit is further configured to cause the voltage circuit to generate each of the first reference voltage and the second reference voltage that equals the battery voltage.

12. The power management circuit of claim 11 wherein, in response to determining that the plurality of power amplifiers is inactive, the control circuit is further configured to:
cause the plurality of first hybrid circuits to each regulate the first reference voltage at a respective one of the plurality of voltage outputs; and
cause the plurality of second hybrid circuits to each block the second reference voltage from a respective one of the plurality of voltage outputs.

13. The power management circuit of claim 10 wherein the control circuit is further configured to:
receive a first target voltage that a first desired level of a first one of the plurality of time-variant voltages is required by a first one of the plurality of power amplifiers;
cause the voltage circuit to generate the first reference voltage higher than the battery voltage to thereby raise the first one of the plurality of time-variant voltages to a first predefined level substantially close to the first desired level within a defined temporal limit; and
cause the voltage circuit to generate the second reference voltage higher than or equal to the battery voltage.

14. The power management circuit of claim 13 wherein the control circuit is further configured to:
cause a first one of the plurality of first hybrid circuits to pass the first reference voltage to a first one of the plurality of voltage outputs coupled to the first one of the plurality of power amplifiers; and
cause a first one of the plurality of second hybrid circuits to pass the second reference voltage to the first one of the plurality of voltage outputs coupled to the first one of the plurality of power amplifiers.

15. The power management circuit of claim 14 wherein the control circuit is further configured to cause the first one of the plurality of first hybrid circuits to block the first reference voltage from the first one of the plurality of voltage outputs coupled to the first one of the plurality of power amplifiers when the first one of the plurality of time-variant voltages reaches the first predefined level.

16. The power management circuit of claim 14 wherein the control circuit is further configured to:
determine that a second one of the plurality of power amplifiers remains inactive;

cause a second one of the plurality of first hybrid circuits to block the first reference voltage from a second one of the plurality of voltage outputs coupled to the second one of the plurality of power amplifiers; and cause a second one of the plurality of second hybrid circuits to block the second reference voltage from the second one of the plurality of voltage outputs coupled to the second one of the plurality of power amplifiers.

17. The power management circuit of claim 14 wherein the control circuit is further configured to:

receive a second target voltage that a second desired level of a second one of the plurality of time-variant voltages is required by a second one of the plurality of power amplifiers;

cause a second one of the plurality of first hybrid circuits to pass the first reference voltage to a second one of the plurality of voltage outputs coupled to the second one of the plurality of power amplifiers to thereby raise the second one of the plurality of time-variant voltages to a second predefined level substantially close to the first desired level within the defined temporal limit; and cause a second one of the plurality of second hybrid circuits to pass the second reference voltage to the second one of the plurality of voltage outputs coupled to the second one of the plurality of power amplifiers.

18. The power management circuit of claim 17 wherein the control circuit is further configured to cause the second one of the plurality of first hybrid circuits to block the first reference voltage from the second one of the plurality of voltage outputs coupled to the second one of the plurality of power amplifiers when the second one of the plurality of time-variant voltages reaches the second predefined level.

19. The power management circuit of claim 18 wherein the control circuit is further configured to cause the second one of the plurality of second hybrid circuits to regulate the second reference voltage at the second one of the plurality of voltage outputs when the second desired level is lower than the first desired level.

20. The power management circuit of claim 18 wherein the control circuit is further configured to cause the second one of the plurality of second hybrid circuits to pass the second reference voltage to the second one of the plurality of voltage outputs when the second desired level is higher than or equal to the first desired level.

* * * * *